(12) United States Patent
Hung

(10) Patent No.: US 6,992,901 B1
(45) Date of Patent: Jan. 31, 2006

(54) SHIELDING DEVICE FOR AN ELECTRONIC APPARATUS

(75) Inventor: Chuan-Min Hung, Taipei (TW)

(73) Assignee: Inventec Appliances Corp., Taipei (TW)

(*) Notice: Subject to any disclaimer, the term of this patent is extended or adjusted under 35 U.S.C. 154(b) by 0 days.

(21) Appl. No.: 11/082,821

(22) Filed: Mar. 18, 2005

(51) Int. Cl.
*H05K 9/00* (2006.01)

(52) U.S. Cl. ............... 361/818; 361/800; 361/816; 174/35 R; 174/35 GC

(58) Field of Classification Search ......... 361/753, 361/799, 800, 816, 818; 174/35 R, 35 GC, 174/35 MS; 439/607; 333/12; 330/68; 334/85; 315/85
See application file for complete search history.

(56) References Cited

U.S. PATENT DOCUMENTS

| | | | | |
|---|---|---|---|---|
| 5,354,951 A | * | 10/1994 | Lange et al. | 174/35 R |
| 6,002,086 A | * | 12/1999 | Yajima | 174/35 R |
| 6,191,950 B1 | * | 2/2001 | Cox et al. | 361/737 |
| 6,313,400 B1 | * | 11/2001 | Mosquera et al. | 174/35 R |
| 6,472,595 B1 | * | 10/2002 | Huang | 174/35 R |
| 6,552,261 B2 | * | 4/2003 | Shlahtichman et al. | 174/35 R |
| 6,872,880 B2 | * | 3/2005 | King et al. | 174/35 R |
| 6,930,891 B1 | * | 8/2005 | Hama et al. | 361/800 |
| 2002/0126466 A1 | * | 9/2002 | Suzuki et al. | 361/818 |
| 2004/0256128 A1 | * | 12/2004 | King et al. | 174/35 R |

FOREIGN PATENT DOCUMENTS

| | | | |
|---|---|---|---|
| GB | 2156162 | * | 12/1993 |
| JP | 5335773 | * | 10/1985 |

* cited by examiner

*Primary Examiner*—Kamand Cuneo
*Assistant Examiner*—Dameon E. Levi
(74) *Attorney, Agent, or Firm*—Troxell Law Office, PLLC

(57) ABSTRACT

A shielding device includes an upper metal plate having downwardly extending and alternately disposed first and second plate sections and a lower metal plate having upwardly extending and alternately disposed third and fourth plate sections. Each of the first and fourth plate sections has an intermediate horizontal segment extending parallel to a respective metal plate. Each of the second and third plate sections has a recess structure such that after assembly the intermediate horizontal segments of the first and fourth plate sections are confined by opposite sidewalls of the recesses in the second and third plate sections, thereby preventing movement of the upper metal plate relative to the lower metal plate.

6 Claims, 4 Drawing Sheets

SHIELDING DEVICE FOR AN ELECTRONIC APPARATUS

FIELD OF THE INVENTION

The present invention relates to a shielding device, more particularly a shielding device that can be assembled easily and that encloses an electronic apparatus therein for preventing the latter from being disrupted by electromagnetic field in the radio frequency spectrum caused by nearby electronic instrument.

BACKGROUND OF THE INVENTION

Due to rapid advance of telecommunication technology, cabled network are gradually replaced by wireless network.

When we say WLAN (wireless local area network), an electronic instrument (such as a Personal Computer) can be connected to the WLAN via the Access Point by using a wireless card (generally 802.11g network card) so that the user can browse the web or access the information from the internet. Generally speaking, the WLAN is similar to Ethernet, except that the computer is connected to the WLAN without the cable, but rather by using the wireless network card.

Nowadays, many international airports and international hotels provides the Wireless Access Point services so that the roaming customer can easily connect his notebook computer (or PDA: personal digital assistant) to the Internet for sending e-mails, conducting business communication, browsing the web if the notebook computer is built using WiFi radio technology. In other words, by using the wireless network card access to the Internet is possible via the Access Point.

Note that the wireless network card is generally packed in a shielding device in order to prevent the same from being disrupted by electromagnetic field caused by a nearby electronic instrument. As we all know if somebody uses an electronic instrument (such as hair dryer or mobile phone) nearby while we are watching TV, the latter is susceptible to be disrupted by the electromagnetic field caused by operation of the hair dryer. Under this condition, flickering spots or snowflakes will be formed on the TV screen, thereby blurring the displaying images. Once the operation of the hair dryer is stopped, the images displaying in the TV screen will retrieve their clarity. Electromagnetic interference can therefore degrade and lower the capability of an electronic apparatus.

FIG. 1 shows an exploded view of a conventional shielding device 50 that encloses the wireless network card (not shown) therein and that includes an upper metal plate 12 and a lower metal plate 14. The upper metal plate 12 has a width W1 slightly shorter than the width W2 of the lower metal plate 14. The upper metal plate 12 has two opposite edges and left and right side walls 121, 122 extending downwardly from the opposite edges. Each of the left and right side walls 121, 122 is formed with pluralities of engagement tongues 1211 and engaging holes 1212 that are disposed alternately along the respective edge. The lower metal plate 14 has two opposite edges and left and right side walls 141, 142 extending upwardly from the opposite edges. Each of the left and right side walls 141, 142 is formed with pluralities of engagement tongues 1411 and engaging holes 1412 that are disposed alternately along the respective edge. In order to encloses the wireless network card therebetween, the upper metal plate 12 is press-fitted into the lower metal plate 14 such that after assembly the engagement tongues 1211 of the upper metal plate 12 engage the peripheries defining the engaging holes 1411 in the lower metal plate 14 while the engagement tongues 1412 of the lower metal plate 14 engage the peripheries defining the engaging holes 1411 in the upper metal plate 12 by virtue of slight difference between the widths W1 and W2.

The aforementioned conventional shielding device 50 does provide the wireless network card from being disrupted by the electromagnetic field caused by the nearby electronic instrument. However, disassembling of the same is somewhat difficult due to tight engagement of the tongues 1211, 1412 within the engaging holes 1411, 1211. In case the wireless network card gets out of order and requires repairing, long disassembly time is needed to separate the upper metal plate 12 from the lower metal plate 14.

SUMMARY OF THE INVENTION

The object of the present invention is to provide a shielding device that can enclose an electronic apparatus (such as a wireless network card) therein and that includes upper and lower metal plates of unique structure to facilitate assembling and disassembling.

In one aspect of the present invention, an electromagnetic shielding device is provided for preventing an electronic apparatus from being disrupted by electromagnetic field caused by nearby electronic instrument. The shielding device accordingly includes: a first plate having two edges, each of which is formed with pluralities of first and second plate sections that are disposed alternately along a respective edge thereof, each of the first plate sections having a first segment extending from the respective edge of the first metal plate, a second segment offsetting from the first segment, and an intermediate segment interconnecting the first segment and the second segment, each of the second plate sections having two opposite side faces, a bottom recess and an upper protrusive block that is disposed at an elevation higher than the bottom recess and that is formed on one of the opposite side faces; and a second plate disposed right below the first plate, and having two edges, each of which is formed with pluralities of third and fourth plate sections that are disposed alternately along a respective edge thereof, each of the third plate sections having two opposite side faces, an upper recess and a lower protrusive block that is disposed at an elevation lower than the upper recess and that is formed on one of the opposite side faces, each of the fourth plate sections having a lower vertical segment extending upwardly from the respective edge of the second plate, an upper vertical segment offsetting from the lower vertical segment, and an intermediate segment interconnecting the lower vertical segment and the upper vertical segment. Once assembled, the intermediate segment of a respective one of the first plate sections in the first plate is seated on the upper recess of a respective one of the third plate sections in the second plate while the second segment of the respective one of the first plate sections in the first plate is supported by the lower protrusive block of a respective one of the third plate sections in the second plate and that the intermediate segment of a respective one of the fourth plate sections in the second plate supports the bottom recess of a respective one of the second plate sections in the first plate while the upper protrusive block of the respective one of the second plate sections in the first plate is supported by the upper vertical segment of the respective one of the fourth plate sections in the second plate.

In another aspect of the present invention, an electromagnetic shielding device is provided for preventing an electronic apparatus from being disrupted by electromagnetic field caused by nearby electronic instrument. The electromagnetic shielding device accordingly includes: a first plate having two edges, each of which is formed with pluralities of first and second plate sections that are disposed alternately along a respective edge thereof, each of the first plate sections having a first segment extending from the respective edge of the first plate, a second segment offsetting from the first segment, and an intermediate segment interconnecting the first segment and the second segment, each of the second plate sections having two opposite side faces, a bottom recess and an upper fish fin that is disposed at an elevation higher than the bottom recess and that projects outwardly from one of the opposite side faces; and a second plate disposed right below the first plate and having two edges, each of which is formed with pluralities of upwardly extending third and fourth plate sections that are disposed alternately along a respective edge thereof, each of the third plate sections having two opposite side faces, an upper recess and a lower fish fin that is disposed at an elevation lower than the upper recess and that projects outwardly from one of the opposite side faces, each of the fourth plate sections having a lower vertical segment extending upwardly from the respective edge of the lower metal plate, an upper vertical segment offsetting from the lower vertical segment and an intermediate segment interconnecting the lower vertical segment and the upper vertical segment. Once assembled, the intermediate segment of a respective one of the first plate sections in the first plate is seated on the upper recess of a respective one of the third plate sections in the second plate while the second segment of the respective one of the first plate sections in the first plate is clamped by the fish fin of a respective one of the third plate sections in the second plate and that the intermediate segment of a respective one of the fourth plate sections in the second plate supports the bottom recess of a respective one of the second plate sections in the first plate while the upper vertical segment of the respective one of the fourth plate sections in the second plate is clamped by the fish fin of the respective one of the second plate sections in the first plate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
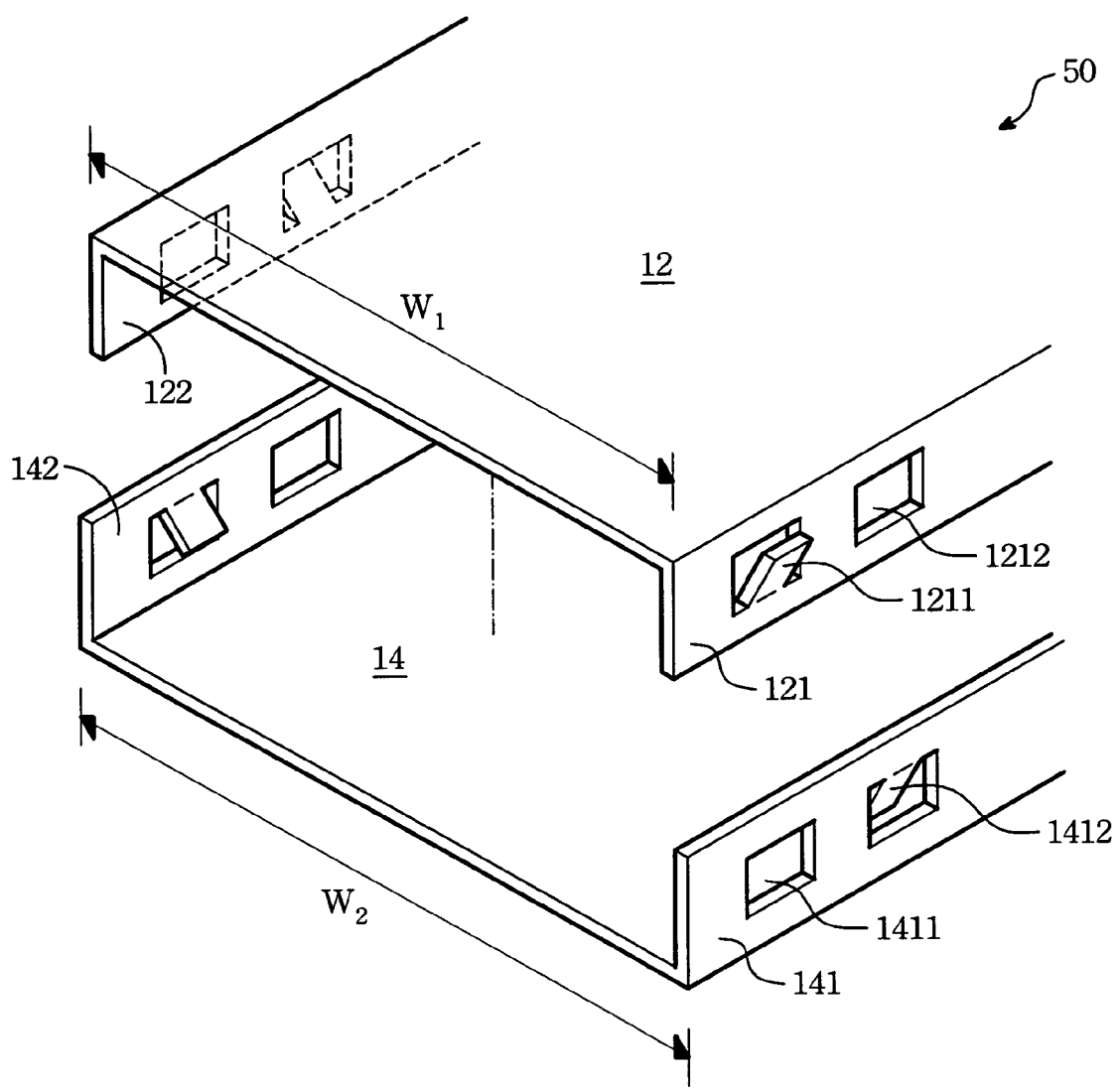
FIG. 1 shows an exploded view of a conventional shielding device for a wireless network card.
Figure 2:
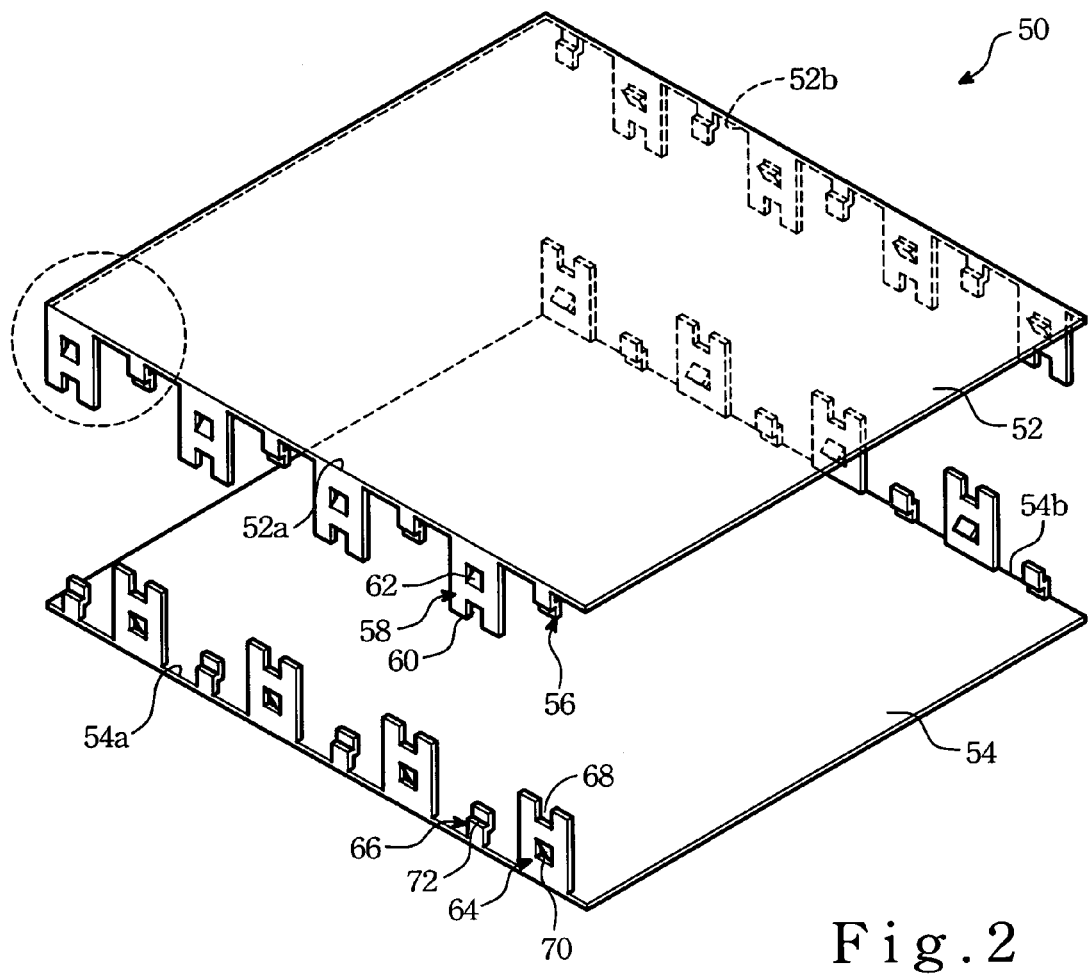
FIG. 2 shows an exploded view of an electromagnetic shielding device of the present invention for enclosing a wireless network card therein.
Figure 3:
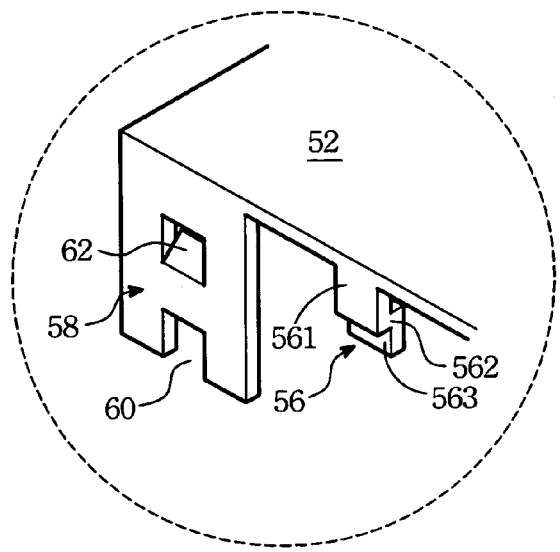
FIG. 3 is an enlarged view of an encircled portion of the electromagnetic shielding device shown in FIG. 2.

Referring to FIGS. 2 and 3, a shielding device 50 of the present invention is shown to include a first plate 52 and a second plate 54. According to the drawings and in order to better understanding of the present invention, the first and second plates will be called upper and lower metal plates 52, 54 which cooperatively enclose an electronic apparatus (not shown) therebetween for preventing the latter from being disrupted by electromagnetic field in the radio frequency spectrum caused by nearby electronic instrument (such as operation of a mobile phone). The electronic apparatus can be a wireless network card (preferably 802.11g network card).

As illustrated, the upper metal plate 52 has two opposite edges (52a, 52b), each of which is formed with pluralities of downwardly extending first and second plate sections 56, 58 that are disposed alternately along a respective edge thereof. Each first plate section 56 has an upper vertical segment 561 (a first segment) extending downwardly from the respective edge of the upper metal plate 52, a lower vertical segment 563 (a second segment) offsetting from the upper vertical segment 561, and an intermediate segment 562 interconnecting the upper vertical segment 561 and the lower vertical segment 563. Each second plate section 58 has two opposite side faces, a bottom recess 60 and an upper fish fin 62 that is disposed at an elevation higher than the bottom recess 60 and that projects outwardly from one of the opposite side faces.

The lower metal plate 54 is disposed below the upper metal plate 52, and has two opposite edges (54a, 54b), each of which is formed with pluralities of upwardly extending third and fourth plate sections 64, 66 that are disposed alternately along a respective edge thereof. Each third plate section 64 has two opposite side faces, an upper recess 68 and a lower fish fin 70 that is disposed at an elevation lower than the upper recess 68 and that projects outwardly from one of the opposite side faces. Each fourth plate section 66 has a lower vertical segment extending upwardly from the respective edge of the lower metal plate 54, an upper vertical segment offset from the lower vertical segment, and an intermediate segment 72 interconnecting the lower vertical segment and the upper vertical segment.

Figure 4:
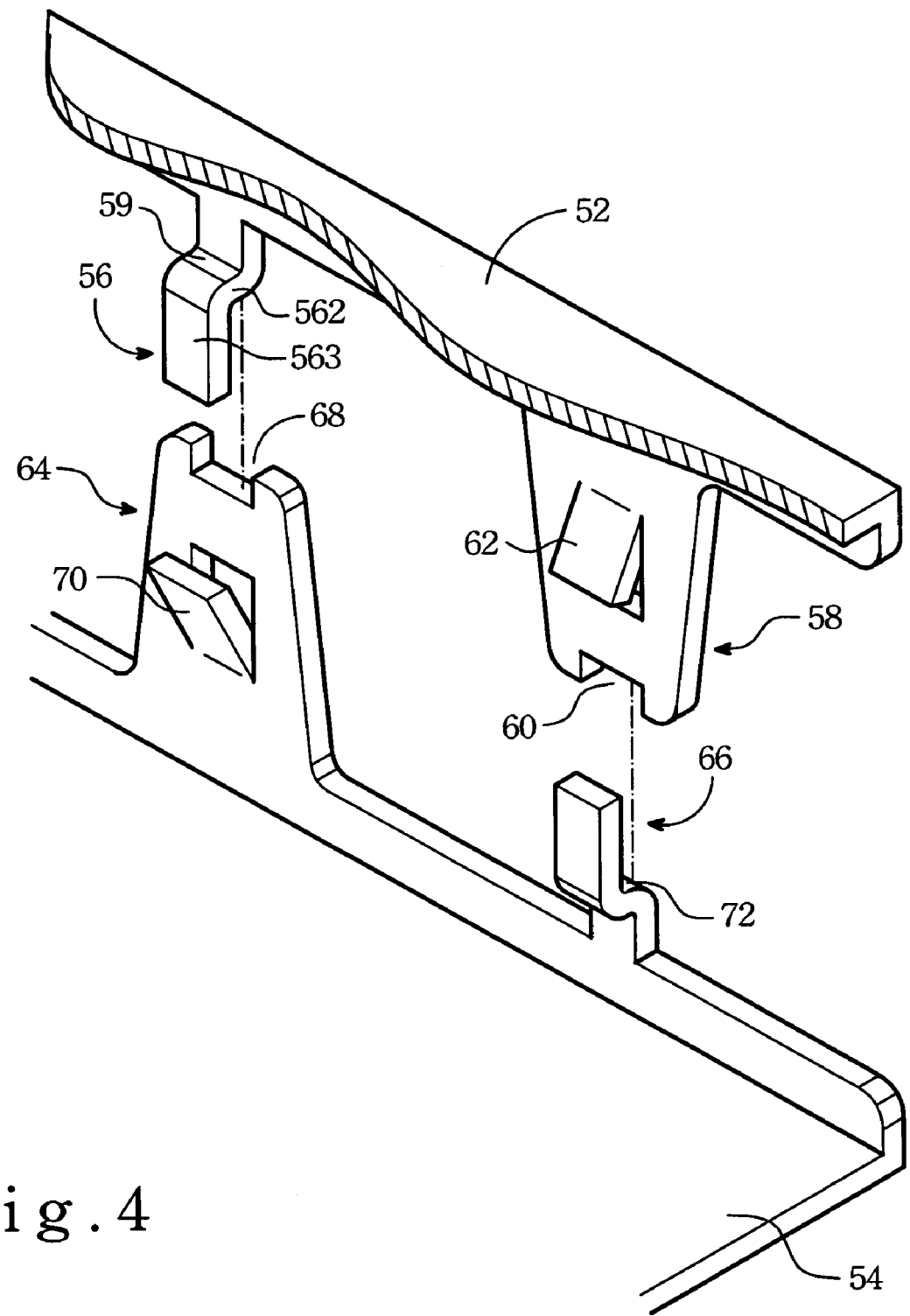
FIG. 4 illustrates how upper and lower metal plates of the electromagnetic shielding device of the present invention are coupled together in order to enclose the wireless network card therein.

Referring to FIG. 4, once assembled, the intermediate segment 562 of a respective one of the first plate sections 56 in the upper metal plate 52 is seated on the upper recess 68 of a respective one of the third plate sections 64 in the lower metal plate 54 while the lower vertical segment 563 of the respective one of the first plate sections 56 in the upper metal plate 52 is clamped by the fish fin 70 of a respective one of the third plate sections 64 in the lower metal plate 54 and that the intermediate segment 72 of a respective one of the fourth plate sections 66 in the lower metal plate 54 supports the bottom recess 60 of a respective one of the second plate sections 58 in the upper metal plate 52 while the upper vertical segment of the respective one of the fourth plate sections 66 in the lower metal plate 54 is clamped by the fish fin 62 of the respective one of the second plate sections 58 in the upper metal plate 52.

In this embodiment, each of the fish fins 62(70) is formed by punching an inverted U-shaped slit through the respective plate section and bending the punched portion outwardly from one of the opposite side faces (see FIGS. 3 and 4 show two types of punching). Alternatively, a tiny strip of metal piece is welded (not shown) onto one of the side faces of the respective plate section in order to form the fish fin 62(70)

on the respective plate section of the upper and lower metal plates 52,54. The intermediate segment 562 (72) of each of the first and fourth plate sections 56, 66 extends parallel to a respective one of the upper and lower metal plates 52, 54. An important aspect to note that since the lower and upper vertical segments of the first and fourth plate sections 56, 66 are clamped by the fish fins 64, 62 of the third and second plate sections 64, 58, the upper metal plate 52 is prevented from moving in the left-and-right direction with respect to the lower metal plate 54. In addition, each of the upper and bottom recesses 68, 60 of the lower and upper metal plates 54, 52 has opposite open-ended sides and opposite front and rear side walls which abut to confine two opposite ends of the intermediate horizontal segment 562(72) of a respective one of the first and fourth plate sections 56, 66, thereby preventing the upper metal plate 52 from moving in the front-and-rearward direction with respect to the lower metal plate 54. After assembly, the assembly of the upper and lower metal plates 52, 54 is packed preferably in a water-resistant wrapper or sheath (not shown) with only the connecting terminals thereof are exposed to facilitate for connecting purposes. Of course, the wrapper can be printed with a Trademark (such as SONY) of the manufacturer's company. Under this condition, when the wireless network card is required to be repaired once damaged, after detachment of the water-resistant wrapper, the upper metal plate 52 can be removed from the lower metal plate 54 with ease.

Figure 5:
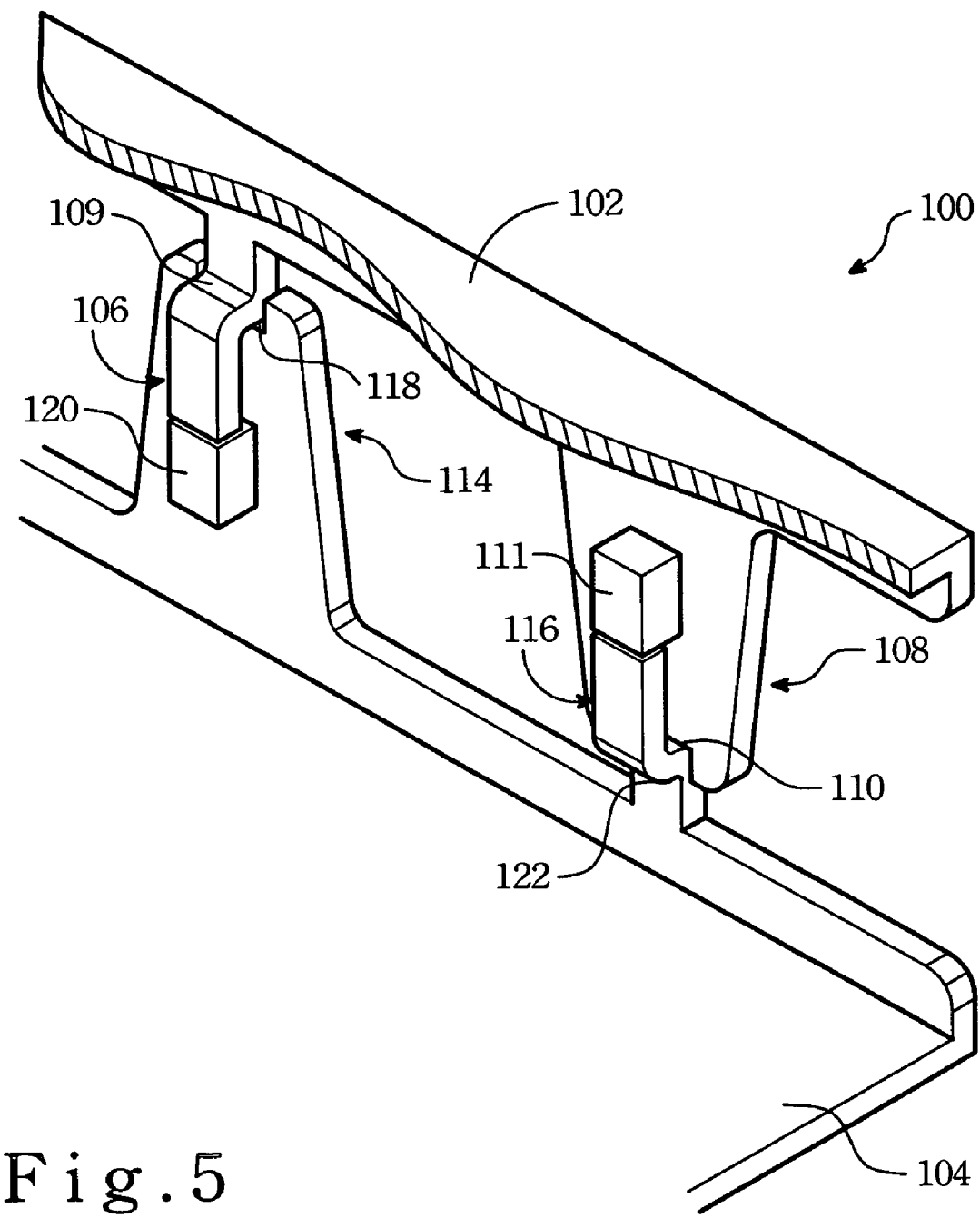
FIG. 5 shows a fragmentary perspective view of a modified electromagnetic shielding device of the present invention for enclosing the wireless network card therein.

FIG. 5 shows a modified shielding device of the present invention and includes an upper metal plate 102 and a lower metal plate 104. The upper metal plate 102 has two opposite edges, each of which is formed with pluralities of downwardly extending first and second plate sections 106, 108 that are disposed alternately along a respective edge thereof. Each first plate section 106 has an upper vertical segment extending downwardly from the respective edge of the upper metal plate 102, a lower vertical segment offset from the upper vertical segment, and an intermediate segment 109 interconnecting the upper vertical segment and the lower vertical segment. Each second plate section 108 has two opposite side faces, a bottom recess 110 and an upper protrusive block 111 that is disposed at an elevation higher than the bottom recess 110 and that is formed on one of the opposite side faces.

The lower metal plate 104 has two opposite edges, each of which is formed with pluralities of upwardly extending third and fourth plate sections 114, 116 that are disposed alternately along a respective edge thereof. Each third plate section 114 has two opposite side faces, an upper recess 118 and a lower protrusive block 120 that is disposed at an elevation lower than the upper recess 118 and that is formed on one of the opposite side faces. Each fourth plate section 116 has a lower vertical segment extending upwardly from the respective edge of the lower metal plate 104, an upper vertical segment offset from the lower vertical segment, and an intermediate segment 122 interconnecting the lower vertical segment and the upper vertical segment.

Once assembled, the intermediate segment 109 of a respective one of the first plate sections 106 in the upper metal plate 102 is seated on the upper recess 118 of a respective one of the third plate sections 114 in the lower metal plate 104 while the lower vertical segment of the respective one of the first plate sections 106 in the upper metal plate 102 is supported by the lower protrusive block 120 of a respective one of the third plate sections 114 in the lower metal plate 104 and that the intermediate segment 122 of a respective one of the fourth plate sections 116 in the lower metal plate 104 supports the bottom recess 110 of a respective one of the second plate sections 108 in the upper metal plate 162 while the upper protrusive block 111 of the respective one of the second plate sections 108 in the upper metal plate 102 is supported by the upper vertical segment of the respective one of the fourth plate sections 116 in the lower metal plate 104. In this modified embodiment, the intermediate segment of each of the first and fourth plate sections 106, 116 extends parallel to a respective one of the upper and lower metal plates 102, 104.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. An electromagnetic shielding device comprising:
   a first plate having two edges, each of which is formed with pluralities of first and second plate sections that are disposed alternately along a respective edge thereof, each of the first plate sections having a first segment extending from the respective edge of the first metal plate, a second segment offsetting from the first segment, and an intermediate segment interconnecting the first segment and the second segment, each of the second plate sections having two opposite side faces, a bottom recess and an upper protrusive block that is disposed at an elevation higher than the bottom recess and that is formed on one of the opposite side faces; and
   a second plate detachably connected to the first plate, and having two edges, each of which is formed with pluralities of third and fourth plate sections that are disposed alternately along a respective edge thereof, each of the third plate sections having two opposite side faces, an upper recess and a lower protrusive block that is disposed at an elevation lower than the upper recess and that is formed on one of the opposite side faces, each of the fourth plate sections having a lower vertical segment extending upwardly from the respective edge of the second plate, an upper vertical segment offsetting from the lower vertical segment, and an intermediate segment interconnecting the lower vertical segment and the upper vertical segment;
   whereby, once assembled, the intermediate segment of a respective one of the first plate sections in the first plate is seated on the upper recess of a respective one of the third plate sections in the second plate while the second segment of the respective one of the first plate sections in the first plate is supported by the lower protrusive block of a respective one of the third plate sections in the second plate and that the intermediate segment of a respective one of the fourth plate sections in the second plate supports the bottom recess of a respective one of the second plate sections in the first plate while the upper protrusive block of the respective one of the second plate sections in the first plate is supported by the upper vertical segment of the respective one of the fourth plate sections in the second plate.

2. The electromagnetic shielding device according to claim 1, wherein the intermediate segment of each of the first and fourth plate sections extends parallel to a respective one of the first and second plates.

3. The electromagnetic shielding device according to claim 1, wherein each of the first and second plates is made from metal.

4. An electromagnetic shielding device comprising:
   a first plate having two edges, each of which is formed with pluralities of first and second plate sections that are disposed alternately along a respective edge thereof, each of the first plate sections having a first segment extending from the respective edge of the first plate, a second segment offsetting from the first segment, and an intermediate segment interconnecting the first segment and the second segment, each of the second plate sections having two opposite side faces, a bottom recess and an upper fish fin that is disposed at an elevation higher than the bottom recess and that projects outwardly from one of the opposite side faces; and a second plate disposed right below the first plate, and having two edges, each of which is formed with pluralities of upwardly extending third and fourth plate sections that are disposed alternately along a respective edge thereof, each of the third plate sections having two opposite side faces, an upper recess and a lower fish fin that is disposed at an elevation lower than the upper recess and that projects outwardly from one of the opposite side faces, each of the fourth plate sections having a lower vertical segment extending upwardly from the respective edge of the second plate, an upper vertical segment offsetting from the lower vertical segment and an intermediate segment interconnecting the lower vertical segment and the upper vertical segment;

whereby, once assembled, the intermediate segment of a respective one of the first plate sections in the first plate is seated on the upper recess of a respective one of the third plate sections in the second plate while the second segment of the respective one of the first plate sections in the first plate is clamped by the fish fin of a respective one of the third plate sections in the second plate and that the intermediate segment of a respective one of the fourth plate sections in the second plate supports the bottom recess of a respective one of the second plate sections in the first plate while the upper vertical segment of the respective one of the fourth plate sections in the second plate is clamped by the fish fin of the respective one of the second plate sections in the first plate.

5. The electromagnetic shielding device according to claim 4, wherein the intermediate segment of each of the first and fourth plate sections extends parallel to a respective one of the first and second plates.

6. The electromagnetic shielding device according to claim 4, wherein each of the first and second plates is made from metal.

* * * * *